(12) United States Patent
Son

(10) Patent No.: US 8,390,014 B2
(45) Date of Patent: Mar. 5, 2013

(54) LIGHT EMITTING DEVICE AND LIGHT EMITTING DEVICE PACKAGE

(75) Inventor: Hyo Kun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 44 days.

(21) Appl. No.: 12/956,561

(22) Filed: Nov. 30, 2010

(65) Prior Publication Data

US 2011/0127565 A1 Jun. 2, 2011

(30) Foreign Application Priority Data

Dec. 1, 2009 (KR) ........................ 10-2009-0118082

(51) Int. Cl.
*H01L 33/00* (2010.01)
*H01L 21/00* (2006.01)
(52) U.S. Cl. ............................................ 257/98; 438/31
(58) Field of Classification Search .................... 257/98, 257/103, 191, 432; 438/29–31
See application file for complete search history.

(56) References Cited

U.S. PATENT DOCUMENTS

| | | | | |
|---|---|---|---|---|
| 5,633,527 A | * | 5/1997 | Lear | 257/432 |
| 5,753,941 A | * | 5/1998 | Shin et al. | 257/98 |
| 6,754,245 B2 | * | 6/2004 | Park et al. | 372/50.11 |
| 6,990,134 B2 | | 1/2006 | Park et al. | |
| 7,324,573 B2 | | 1/2008 | Kaneko et al. | |
| 2004/0012013 A1 | | 1/2004 | Katayama | 257/13 |
| 2004/0190581 A1 | | 9/2004 | Park et al. | 372/96 |

FOREIGN PATENT DOCUMENTS

| | | |
|---|---|---|
| CN | 1369940 | 9/2002 |
| CN | 1383220 | 12/2002 |
| JP | 10-012916 A | 1/1998 |
| KR | 10-2002-0064521 A | 8/2002 |
| KR | 10-2004-0008092 A | 1/2004 |
| KR | 10-2004-0009309 A | 1/2004 |

OTHER PUBLICATIONS

Korean Notice of Allowance dated Nov. 30, 2011 issued in Application No. 10-2009-0118082.

* cited by examiner

*Primary Examiner* — Calvin Lee

(74) *Attorney, Agent, or Firm* — KED & Associates LLP

(57) ABSTRACT

Disclosed is a light emitting device including a second conductive semiconductor layer; an active layer on the second conductive semiconductor layer; a first semiconductor layer on the active layer, the first semiconductor layer having at least one lateral side with a step portion; and a lateral electrode on the step portion formed at the at least one lateral side of the first semiconductor layer.

24 Claims, 13 Drawing Sheets ial materials doped with p type impurities. However, the embodiment is not limited thereto. For instance, the second conductive semiconductor layer 150 may include an n type semiconductor layer.

LIGHT EMITTING DEVICE AND LIGHT EMITTING DEVICE PACKAGE

The present application claims priority under 35 U.S.C. §119(a) of Korean Patent Application No. 10-2009-0118082 filed on Dec. 1, 2009, which is hereby incorporated by reference in its entirety.

BACKGROUND

The embodiment relates to a light emitting device and a light emitting device package.

A light emitting diode (LED) is a semiconductor light emitting device that converts current into light. Recently, the brightness of the LED is increased, so that the LED has been employed as a light source for a display device, a vehicle, or a lighting device. In addition, the LED can represent a white color having superior light efficiency by employing luminescence materials or combining LEDs having various colors.

Meanwhile, the brightness of the LED can be changed according to various conditions such as an active layer structure, a light extraction structure for effectively extracting light to the outside, semiconductor materials used for the LED, a chip size, and the type of molding members surrounding the LED.

SUMMARY

The embodiment provides a light emitting device having a novel structure and a light emitting device package having the same. The embodiment provides a light emitting device capable of improving the light extraction efficiency and a light emitting device package having the same. The embodiment provides a light emitting device capable of improving current characteristics while lowering operational voltage and a light emitting device package having the same.

A light emitting device according to the embodiment may include a second conductive semiconductor layer; an active layer on the second conductive semiconductor layer; a first semiconductor layer on the active layer, the first semiconductor layer having at least one lateral side with a step portion; and a lateral electrode on the step portion formed at the at least one lateral side of the first semiconductor layer.

A light emitting device package according to the embodiment may include a substrate and a light emitting module including a light emitting device aligned on the substrate. The light emitting device may include a second conductive semiconductor layer; an active layer on the second conductive semiconductor layer; a first semiconductor layer on the active layer, the first semiconductor layer having at least one lateral side with a step portion; and a lateral electrode on the step portion formed at the at least one lateral side of the first semiconductor layer.

DETAILED DESCRIPTION OF THE EMBODIMENTS

Figure 1:
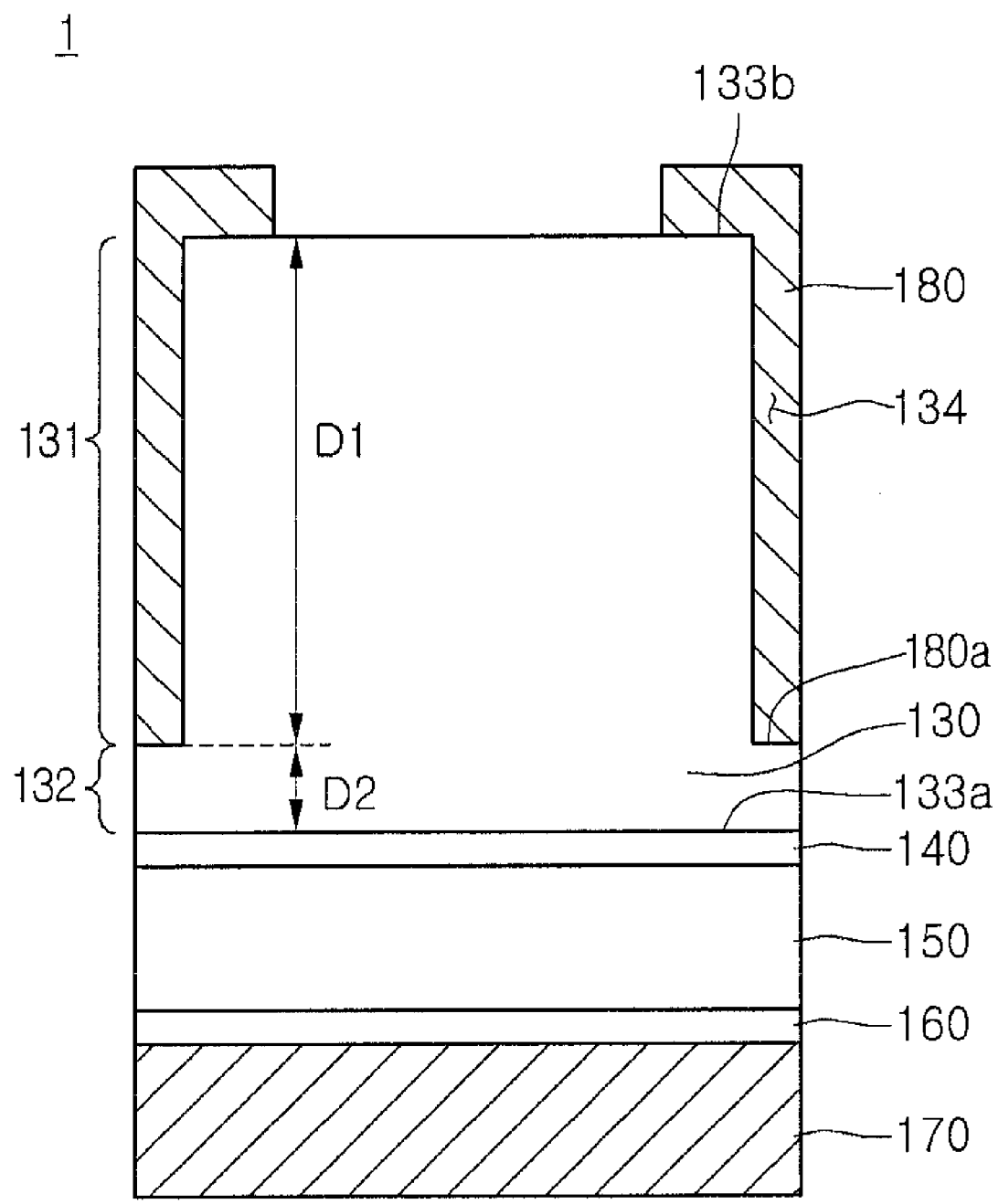
FIG. 1 is a sectional view showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device and a method of manufacturing the same according to the embodiments will be described in detail with reference to accompanying drawings.

Figure 2:
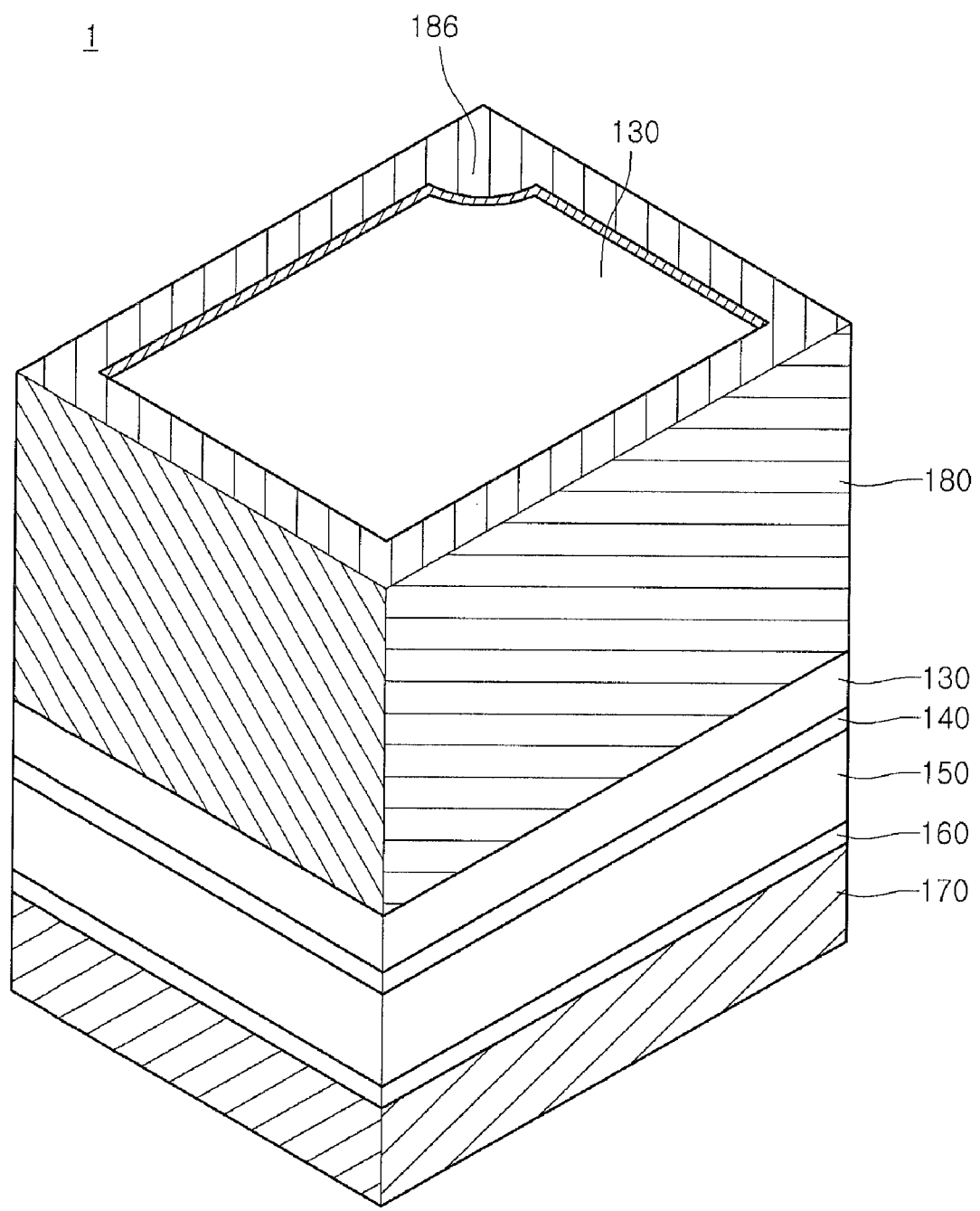
FIG. 2 is a perspective view of a light emitting device shown in FIG. 1.

FIG. 1 is a sectional view showing a light emitting device 1 according to the embodiment and FIG. 2 is a perspective view of the light emitting device 1.

Referring to FIGS. 1 and 2, the light emitting device 1 includes a conductive support member 170, a reflective layer 160 on the conductive support member 170, a second conductive semiconductor layer 150 on the reflective layer 160, an active layer 140 on the second conductive semiconductor, a first semiconductor layer 130 formed on the active layer 140 and provided on at least one side thereof with a step part, and a lateral electrode 180 formed on the step part of the first semiconductor layer 130.

The conductive support member 170 may include at least one selected from the group consisting of Ti, Cr, Ni, Al, Pt, Au, W, Cu, Mo and a carrier wafer, such as Si, Ge, GaAs, ZnO, SiC, SiGe, or GaN.

The conductive support member 170, together with the lateral electrode 180, supplies power to the light emitting device 1 and supports a plurality of layers formed on the conductive support member 170.

The reflective layer 160 is formed on the conductive support member 170. The reflective layer 160 may include at least one of Ag, Al, Pt and Pd having superior reflectance.

Meanwhile, a bonding layer (not shown) can be formed between the reflective layer 160 and the conductive support member 170 to reinforce interfacial bonding strength between the reflective layer 160 and the conductive support member 170.

The second conductive semiconductor layer 150 is formed on the reflective layer 160. For example, the second conductive semiconductor layer 150 includes a p type semiconductor layer. The p type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the p type semiconductor layer maybe doped with p type dopant such as Mg, Zn, Ca, Sr, or Ba.

Meanwhile, an ohmic layer (not shown) can be formed between the second conductive semiconductor layer 150 and the reflective layer 160 for ohmic-contact.

The active layer 140 is formed on the second conductive semiconductor layer 150. Electrons (or holes) injected through the first conductive semiconductor layer 130 may be recombined with holes (or electrons) injected through the second conductive semiconductor layer 150 at the active layer 140, so that the active layer 140 emits the light based on the band gap difference of the energy band according to the intrinsic material of the active layer 140.

The active layer 140 may have a single quantum well structure or a multiple quantum well (MQW) structure, but the embodiment is not limited thereto.

A clad layer (not shown) doped with the n type or p type dopant can be formed on and/or under the active layer 140. The clad layer may include an AlGaN layer or an InAlGaN layer.

The first semiconductor layer 130 may be formed on the active layer 140.

The first semiconductor layer 130 includes a first conductive semiconductor layer. For instance, the first conductive semiconductor layer may include an n type semiconductor layer. The n type semiconductor layer may include semiconductor materials having the compositional formula of $In_xAl_yGa_{1-x-y}N$ ($0 \leq x \leq 1$, $0 \leq y \leq 1$, $0 \leq x+y \leq 1$), such as InAlGaN, GaN, AlGaN, InGaN, AlInN, AlN, or InN. In addition, the n type semiconductor layer may be doped with n type dopant such as Si, Ge or Sn.

According to the present embodiment, the first semiconductor layer 130 includes a first region 131 located at an upper portion of the first semiconductor layer 130, and a second region 132 located between the first region 131 and the active layer 140. A lateral electrode 180 is formed in the first region 131. According to the present embodiment, the lateral electrode 180 is formed on an entire surface of the lateral side of the first region 131, but the embodiment is not limited thereto. According to another embodiment, the lateral electrode 180 may be formed on a part of the lateral side of the first region 131. In this case, the first region 131 is defined as a region extending from an end 180a of the lateral electrode 180 adjacent to a bottom surface 133a of the first semiconductor layer 130 to a top surface 133b of the first semiconductor layer 130.

The etching process can be performed with respect to an outer peripheral portion of at least one side of the first semiconductor layer 130 (see, reference numeral D1). As the etching process has been performed, an etching groove 134 is formed in the first region 131 of the first semiconductor layer 130, so that a step portion is formed on at least one side of the first semiconductor layer 130. In addition, the step portion may be formed on the entire surface of the lateral side of the first semiconductor layer 130.

The etching groove 134 may provide a space for installing the lateral electrode 180 while serving as a chip boundary region for dividing a plurality of light emitting devices.

For instance, the first region 131 may have the first thickness D1 in the range of 1.5 μm to 2.0 μm.

In addition, the lateral electrode 180 may extend to at least a part of an outer peripheral portion of the top surface 133b of the first semiconductor layer 130, but the embodiment is not limited thereto.

Meanwhile, the lateral electrode 180 is not formed in the second region 132 where the etching groove 134 is not formed. In detail, the lateral electrode 180 is not formed in the region extending from the step portion of the first semiconductor layer 130 to the active layer 140. For instance, the second region 132 has the second thickness D2 in the range of 0.1 μm to 0.3 μm.

Since the lateral electrode 180 is formed on the first region 131 and the outer peripheral portion of the top surface 133b of the first semiconductor layer 130, the light emitted through the top surface 133b of the first semiconductor layer 130 may not be lost by the lateral electrode 180, so that the light extraction efficiency of the light emitting device 1 can be improved.

In addition, since the lateral electrode 180 is formed on the first region 131 and the outer peripheral portion of the top surface 133b of the first semiconductor layer 130, the current may uniformly and smoothly flow between the lateral electrode 180 and the conductive support member 170, so that the light extraction efficiency of the light emitting device 1 can be improved and the operational voltage of the light emitting device 1 can be lowered.

Further, since the lateral electrode 180 is not formed in the second region 132 of the first semiconductor layer 130, the lateral electrode 180 may not cause the electric short between the active layer 140 and the second conductive semiconductor layer 150.

The lateral electrode 180 can be formed through the sputtering or E-beam deposition, but the embodiment is not limited thereto.

For instance, the lateral electrode 180 may include at least one of Ag, Al, Pt and Pd having superior reflectance. In this case, the light incident into the lateral electrode 180 from the active layer 140 can be effectively reflected from the lateral electrode 180, so that the light is emitted through the top surface of the first semiconductor layer 130.

In addition, the lateral electrode 180 may include at least one metal oxide selected from the group consisting of ITO, IZO(In—ZnO), GZO(Ga—ZnO), AZO(Al—ZnO), AGZO (Al—Ga ZnO), IGZO(In—Ga ZnO), IrOx, RuOx, RuOx/ITO, Ni/IrOx/Au, and Ni/IrOx/Au/ITO, which have transparent and electric conductive properties. If the lateral electrode 180 includes the material having transparent and electric conductive properties, the light incident into the lateral electrode 180 from the active layer 140 can be effectively emitted through the lateral electrode 180. The lateral electrode 180 can be formed with roughness to improve the light extraction efficiency of the light emitting device 1.

In addition, the lateral electrode 180 may include a first layer deposited on the first region 131 of the first semiconductor layer 131 and a second layer deposited on the first layer. In this case, the first layer may include at least one of Ag, Al, Pt and Pd having superior reflectance, and the second layer may include metallic materials different from the materials of the first layer.

The embodiment does not limit the materials for the lateral electrode 180, and various materials can be used for the lateral electrode 180 according to the design of the light emitting device 1.

A lateral side of the lateral electrode 180 is aligned in line with a lateral side of the second region 132 of the first semiconductor layer 130, a lateral side of the active layer 140, and a lateral side of the second conductive semiconductor layer 150. The above configuration can be obtained because the first semiconductor layer 130 is divided into plural layers by the etching groove 132, the lateral electrode 180 is located in the etching groove 134, and the resultant structure is divided into chip units through the breaking process (see, FIGS. 5 to 10).

Figure 3:
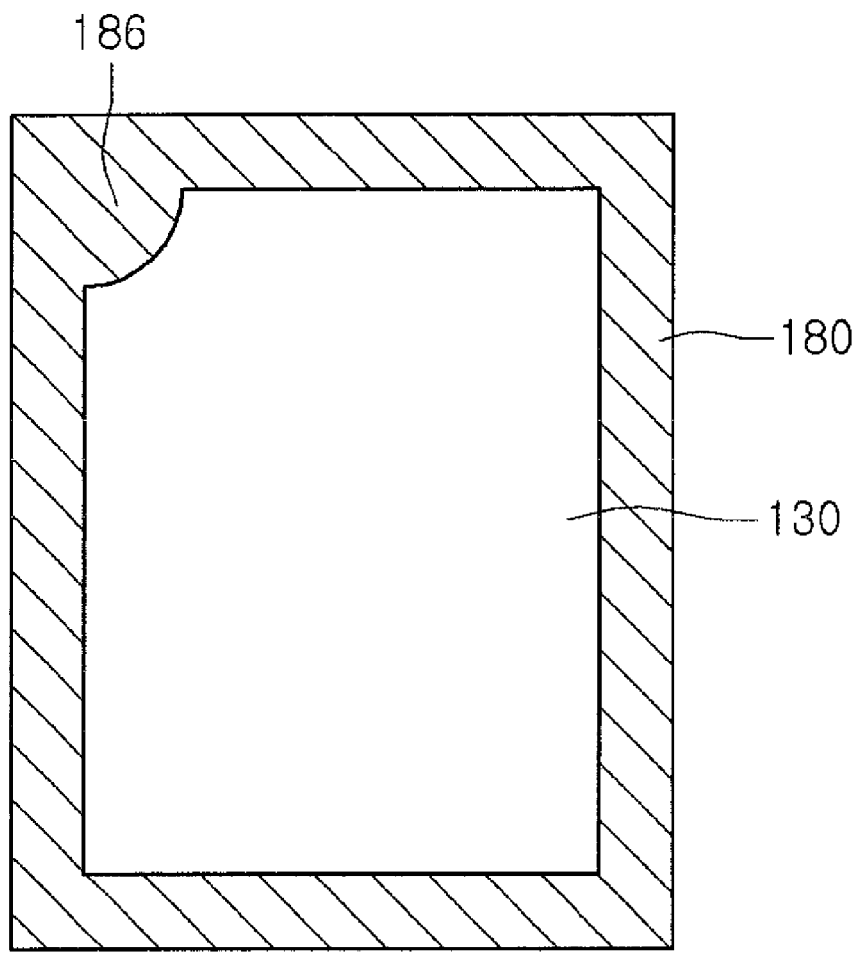
FIG. 3 is a plan view of a light emitting device shown in FIG. 1.

FIG. 3 is a plan view of the light emitting device 1.

Referring to FIGS. 2 and 3, the lateral electrode 180 can be formed even on the outer peripheral portion of the top surface of the first semiconductor layer 130.

In order to bond a wire to the lateral electrode 180, the lateral electrode 180 provided on the outer peripheral portion of the top surface of the first semiconductor layer 130 may include at least one pad part 186.

That is, the lateral electrode 180 may extend to at least one edge of the first semiconductor layer 130, and the pad part 186 can be formed on the lateral electrode 180 provided on at least one edge of the first semiconductor layer 130.

Meanwhile, the lateral electrode 180 may not be formed on the outer peripheral portion of the top surface of the first semiconductor layer 130 except for a region where the pad part 186 is provided, but the embodiment is not limited thereto.

The pad part 186 has an area sufficient for bonding the wire thereto. In addition, the pad part 186 can be formed by performing the plating or depositing process after forming a mask on the top surface of the first semiconductor layer 130, but the embodiment is not limited thereto.

Figure 4:
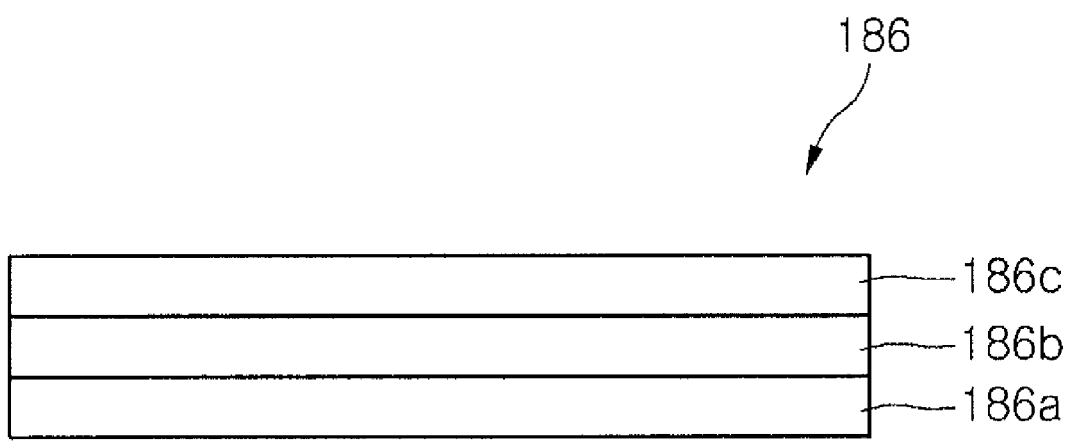
FIG. 4 is a sectional view showing a pad part formed in a light emitting device shown in FIG. 1.

FIG. 4 is a sectional view showing the pad part 186 having a multiple structure.

Different from other regions of the lateral electrode, the pad part 186 may have the multiple structure such that the wire can be easily bonded to the pad part 186.

For instance, the multiple structure includes an ohmic layer 186a, a reflective layer 186b on the ohmic layer 186a, and a bonding layer 186c on the reflective layer 186b, but the embodiment is not limited thereto.

The ohmic layer 186a may include a metallic material having ohmic property. For instance, the ohmic layer 186a may include at least one selected from the group consisting of Cr, Pt and Ni.

The reflective layer 186b may include at least one selected from the group consisting of Ag, Al, Pt and Pd having superior reflectance.

The bonding layer 186c may include Au, Au/Sn, SnPb or a eutectic metal, such as Pb-free solder. The bonding layer 186c has adhesive property such that the wire can be easily bonded to the bonding layer 186c.

Hereinafter, the method of manufacturing the light emitting device 1 will be described in detail with reference to FIGS. 5 to 10. In the following description, details of the elements and structures that have been already described will be omitted in order to avoid redundancy.

Figure 5:
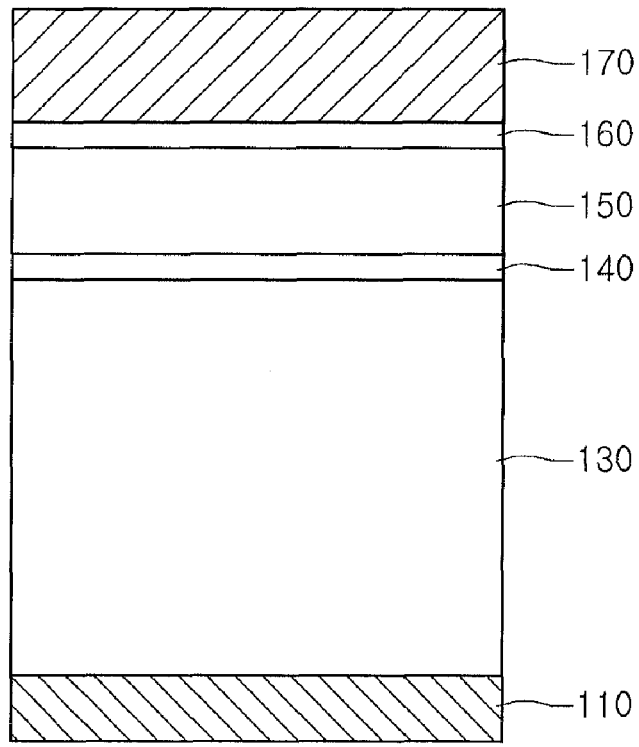
FIGS. 5 to 10 are views showing the procedure for manufacturing a light emitting device according to the embodiment.

Referring to FIG. 5, the first semiconductor layer 130, the active layer 140, the second conductive layer 150, the reflective layer 160, and the conductive support member 170 are sequentially formed on the substrate 110.

The substrate 110 may include at least one selected from the group consisting of $Al_2O_3$, SiC, Si, GaAs, GaN, ZnO, Si, GaP, InP, and Ge.

A buffer layer (not shown) can be formed between the substrate 110 and the first semiconductor layer 130 to attenuate lattice mismatch between the first semiconductor layer 130 and the substrate 110.

For instance, the buffer layer, the first semiconductor layer 130, the active layer 140 and the second conductive semiconductor layer 150 can be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy), but the embodiment is not limited thereto.

Figure 6:
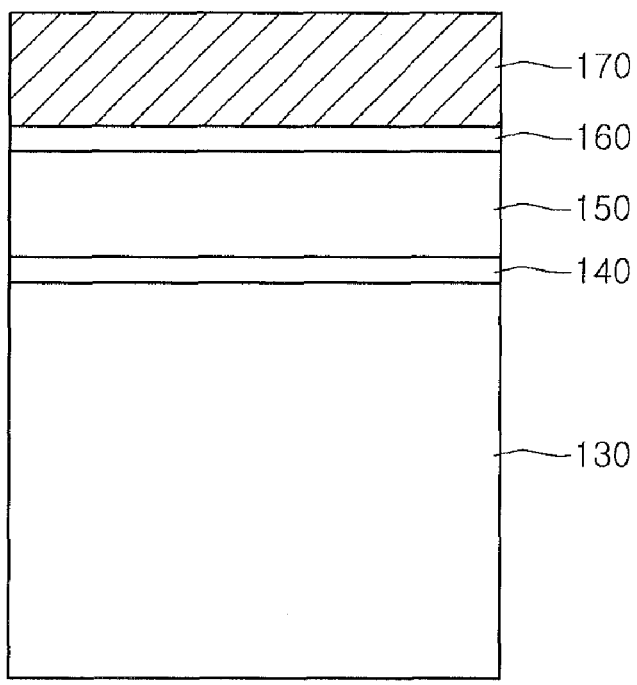

Referring to FIGS. 5 and 6, the substrate 110 is removed through the laser liftoff (LLO) scheme and/or the etching process, but the embodiment is not limited thereto.

Meanwhile, after the substrate 110 has been removed, the first semiconductor layer 130 is partially removed and the surface of the first semiconductor layer 130 is polished through the ICP/RIE (Inductive Coupled Plasma/Reactive Ion Etch) process. As a result, the undoped semiconductor layer included in the first semiconductor layer 130 and the part of the first conductive semiconductor layer may be removed, but the embodiment is not limited thereto.

Figure 7:
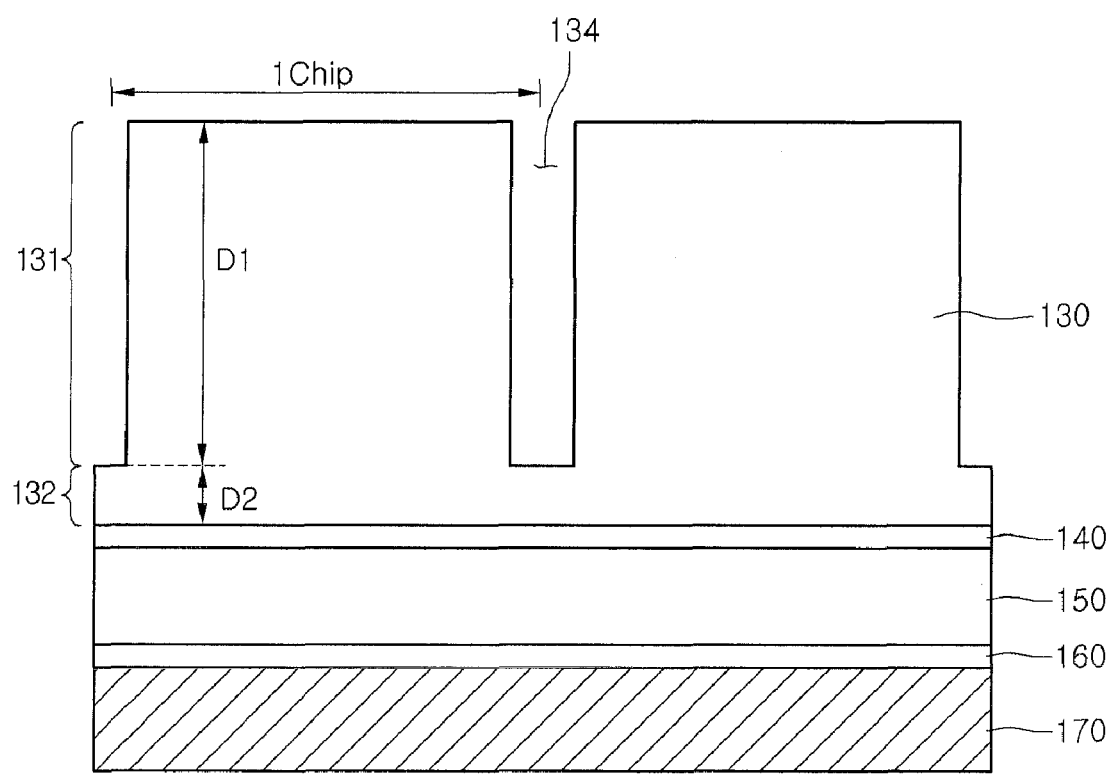
Figure 8:
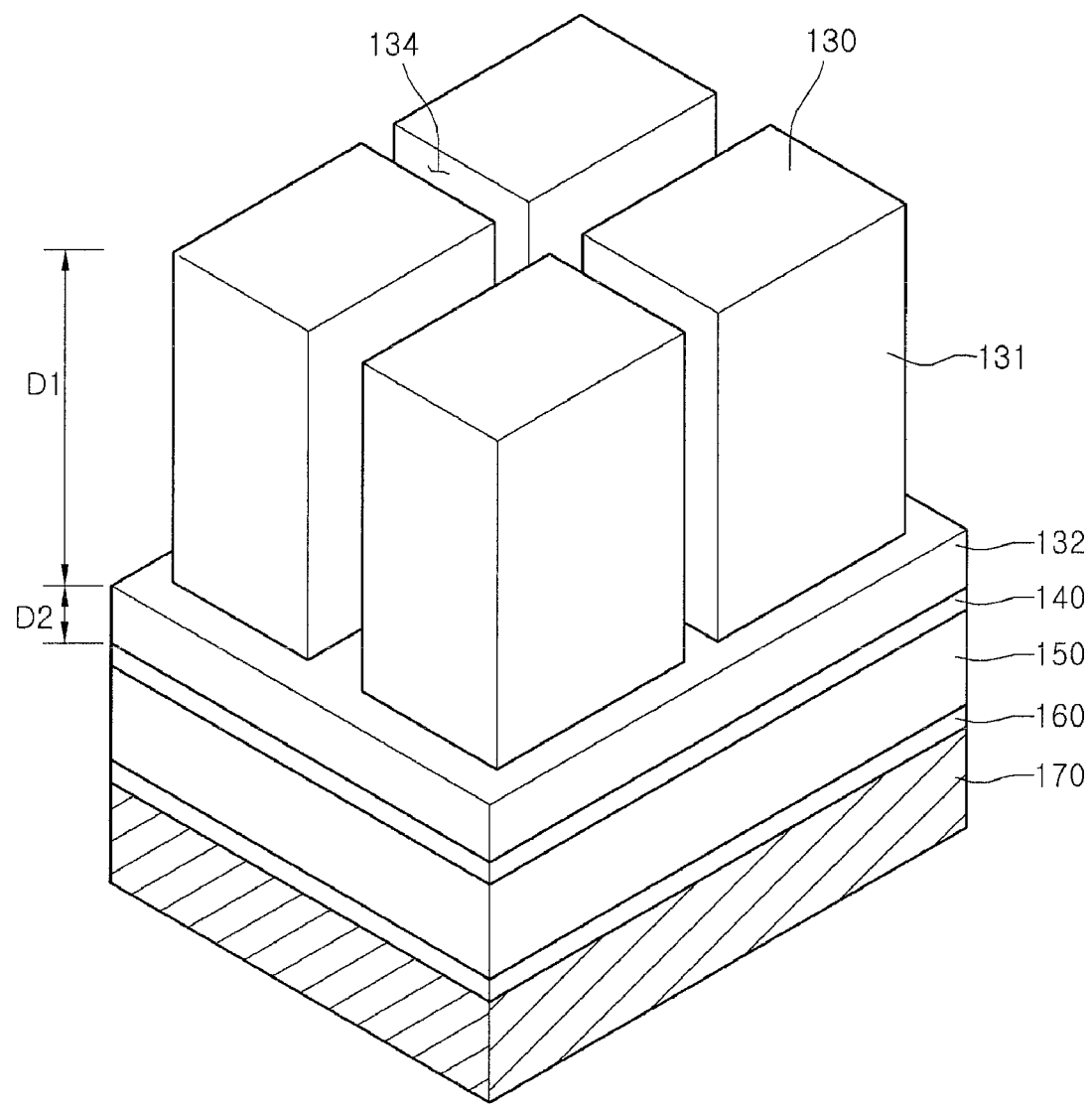

Referring to FIGS. 7 and 8, the etching process is performed such that the etching groove 134 having the first depth D1 can be formed at the chip boundary region of the first semiconductor layer 130, thereby forming the step portion on at least one side of the first semiconductor layer 130. Meanwhile, for the purpose of convenience, the following description will be made on the assumption that the conductive support member 170 is located at the lowermost layer.

The etching groove 134 may provide a space for installing the lateral electrode 180 while serving as a chip boundary region for dividing a plurality of light emitting devices.

The first region 131 of the first semiconductor layer 130 may have the thickness D1 in the range of 1.5 μm to 2.0 μm.

In addition, the second region 132, which is not etched, may have the thickness D2 in the range of 0.1 μm to 0.3 μm.

Figure 9:
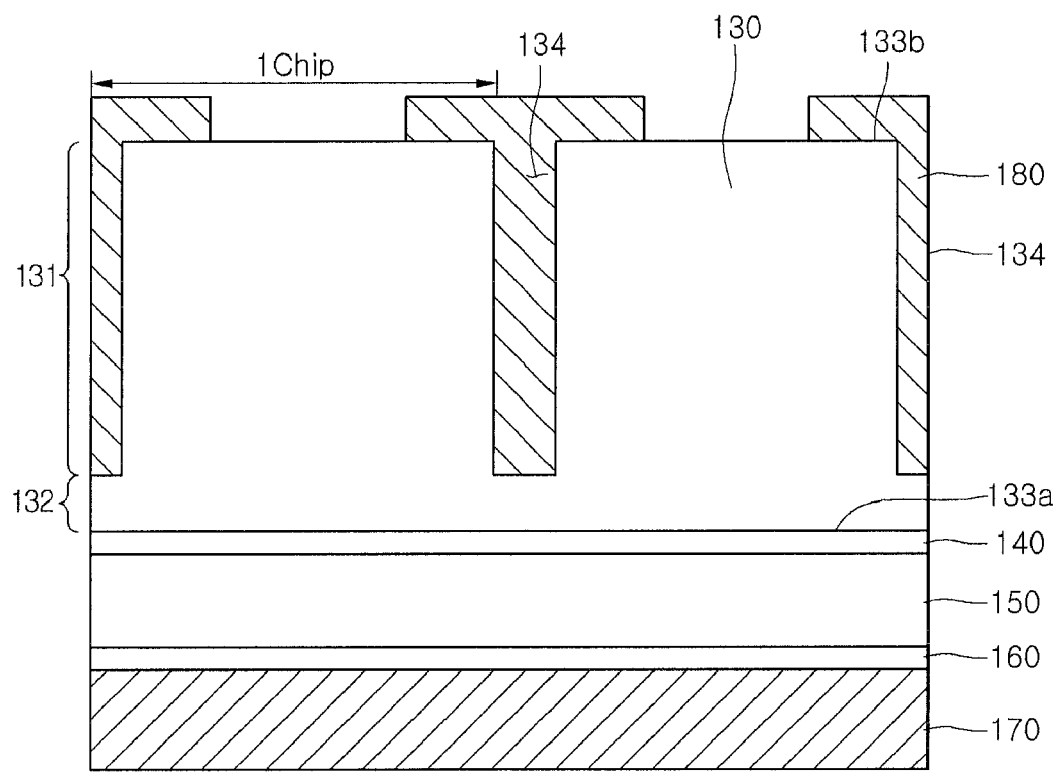
Figure 10:
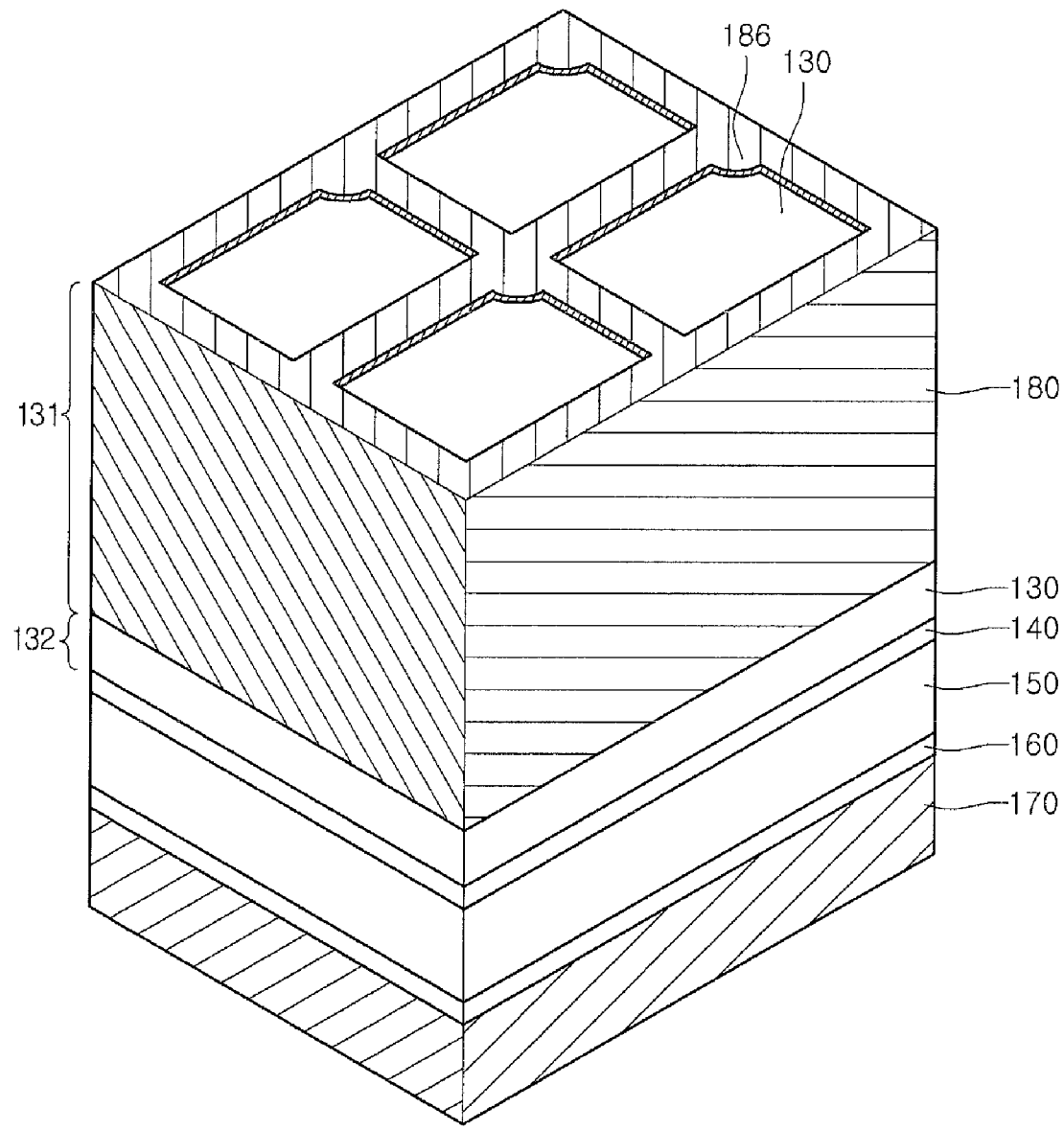

Referring to FIGS. 9 and 10, the lateral electrode 180 can be formed in the first region 131 of the first semiconductor layer 130. That is, the lateral electrode 180 can be formed in the region defined between the step portion of the first semiconductor layer 130 and the top surface of the first semiconductor layer 130. In addition, the lateral electrode 180 may extend to at least a part of an outer peripheral portion of the top surface 133b of the first semiconductor layer 130.

In addition, the lateral electrode 180 may include the pad part 186 to bond the wire to the lateral electrode 180.

Since the lateral electrode 180 is formed on the first region 131 and the outer peripheral portion of the top surface 133b of the first semiconductor layer 130, the light emitted through the top surface 133b of the first semiconductor layer 130 may not be lost by the lateral electrode 180, so that the light extraction efficiency of the light emitting device 1 can be improved.

In addition, since the lateral electrode 180 is formed on the first region 131 and the outer peripheral portion of the top surface 133b of the first semiconductor layer 130, the current may uniformly and smoothly flow between the lateral electrode 180 and the conductive support member 170, so that the light extraction efficiency of the light emitting device 1 can be improved and the operational voltage of the light emitting device 1 can be lowered.

Further, since the lateral electrode 180 is not formed in the second region 132 of the first semiconductor layer 130, the lateral electrode 180 may not cause the electric short between the active layer 140 and the second conductive semiconductor layer 150.

The lateral electrode 180 can be formed through the sputtering or E-beam deposition, but the embodiment is not limited thereto.

For instance, the lateral electrode 180 may include at least one of Ag, Al, Pt and Pd having superior reflectance. In this case, the light incident into the lateral electrode 180 from the active layer 140 can be effectively reflected from the lateral electrode 180, so that the light is emitted through the top surface of the first semiconductor layer 130.

In addition, the lateral electrode 180 may include at least one metal oxide selected from the group consisting of ITO, IZO(In—ZnO), GZO(Ga—ZnO), AZO(Al—ZnO), AGZO (Al—Ga ZnO), IGZO(In—Ga ZnO), IrOx, RuOx, RuOx/ ITO, Ni/IrOx/Au, and Ni/IrOx/Au/ITO, which have transparent and electric conductive properties. If the lateral electrode 180 includes the material having transparent and electric conductive properties, the light incident into the lateral electrode 180 from the active layer 140 can be effectively emitted through the lateral electrode 180. The lateral electrode 180 can be formed with roughness to improve the light extraction efficiency of the light emitting device 1.

In addition, the lateral electrode 180 may include the first layer deposited on the first region 131 of the first semiconductor layer 131 and the second layer deposited on the first layer. In this case, the first layer may include at least one of Ag, Al, Pt and Pd having superior reflectance, and the second layer may include metallic materials different from the materials of the first layer.

The embodiment does not limit the materials for the lateral electrode 180, and various materials can be used for the lateral electrode 180 according to the design of the light emitting device 1.

Meanwhile, the lateral electrode 180 may be formed on at least one lateral side of the first semiconductor layer 130 or the lateral electrode 180 may not be formed on the outer peripheral portion of the top surface 133b of the first semiconductor layer 130, but the embodiment is not limited thereto.

Referring to FIGS. 1, 2, 9 and 10, the breaking process is performed to divide the light emitting devices into chip units, thereby providing the light emitting device 1 according to the embodiment. As the breaking process has been performed, the lateral side of the lateral electrode 180 is aligned in line with the lateral sides of the second region 132, the active layer 140, and the second conductive semiconductor layer 150.

Hereinafter, the light emitting device according to other embodiments will be described in detail with reference to FIGS. 11 to 13. For the purpose of clarity, details of the elements and structures that have been already described will be omitted, and the following description will focused on difference with respect to the previous embodiment.

Figure 11:
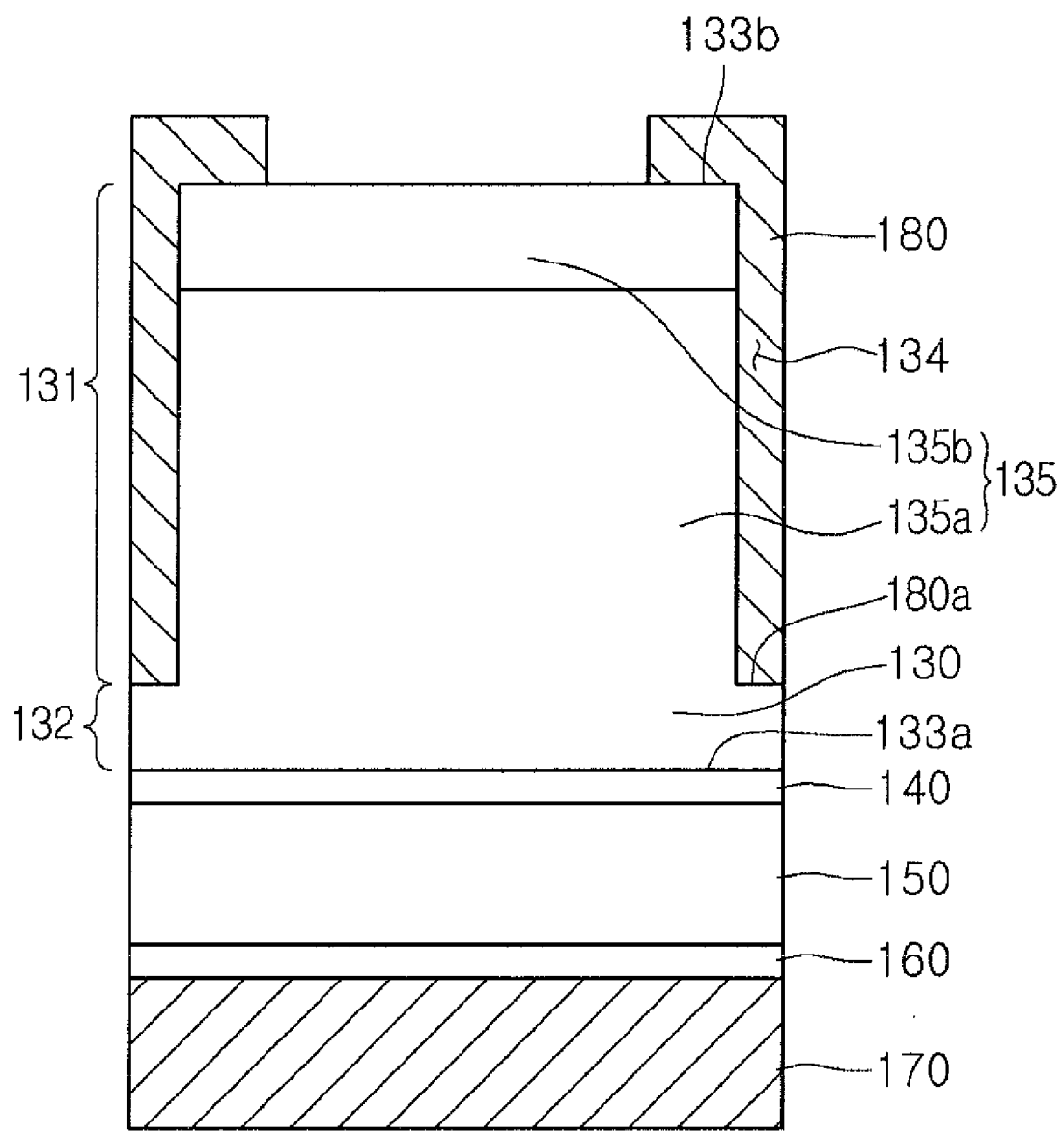
FIG. 11 is a sectional view showing a light emitting device according to another embodiment.

FIG. 11 is a sectional view showing the light emitting device according to another embodiment.

Referring to FIG. 11, a first semiconductor layer 135 according to another embodiment may include a first conductive semiconductor layer 135a and an undoped semiconductor layer 135b formed on the first conductive semiconductor layer 135a. The undoped semiconductor layer 135b is not doped with the conductive dopant, so the undoped semiconductor layer 135b has electric conductivity remarkably lower than that of the first and second conductive semiconductor layers 135a and 150. For instance, the undoped semiconductor layer 135b may include an undoped GaN layer, but the embodiment is not limited thereto.

According to the present embodiment, the undoped semiconductor layer 135b may reduce difference in characteristics between the substrate 110 (see, FIG. 5) and the first conductive semiconductor layer 135a. In addition, an additional process for removing the undoped semiconductor layer 135b may not be required, so the manufacturing process can be simplified.

Since the undoped semiconductor layer 135b is disposed between the top surface of the first conductive semiconductor layer 135a and the lateral electrode 180, the first conductive semiconductor layer 135a can be prevented from being damaged in the process of forming the etching groove 134 (see, FIGS. 7 and 8) and the lateral electrode 180.

In addition, when the lateral electrode 180 includes the transparent conductive material, the undoped semiconductor layer 135b may prevent the light generated from a light emitting structure layer from being concentrated in the vertical direction. In more detail, a portion of the lateral electrode 180 formed on the first semiconductor layer 135 is disposed vertically to the second conductive semiconductor layer 140, the light (especially, blue light) may be concentrated in the vertical direction of the light emitting device. However, according to the present embodiment, the light is laterally emitted through the undoped semiconductor layer 135b. Thus, the efficiency degradation and the degradation of luminescence materials, which are caused when the light is concentrated in the vertical direction, can be effectively prevented.

Figure 12:
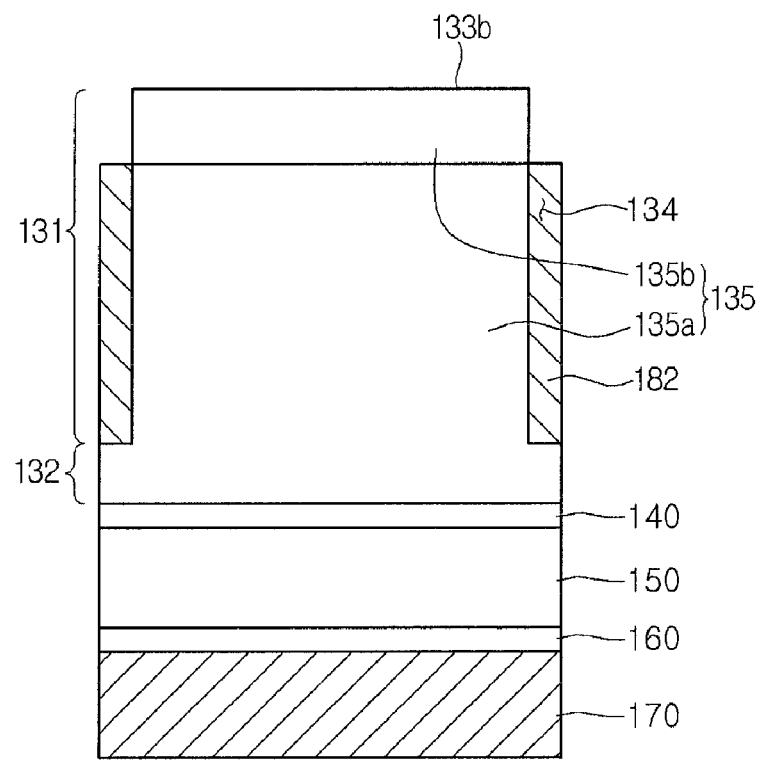
FIG. 12 is a sectional view showing a light emitting device according to still another embodiment.

FIG. 12 is a sectional view showing the light emitting device according to still another embodiment.

Referring to FIG. 12, a first semiconductor layer 135 according to the present embodiment may include a first conductive semiconductor layer 135a and an undoped semiconductor layer 135b formed on the first conductive semiconductor layer 135a. In addition, a lateral electrode 182 is formed on the lateral side of the first conductive semiconductor layer 135a without being formed on the lateral side of the undoped semiconductor layer 135b. In this case, the undoped semiconductor layer 135b can prevent the light from being concentrated in the vertical direction even if the lateral electrode 182 is made from an opaque material, such as a metal.

Figure 13:
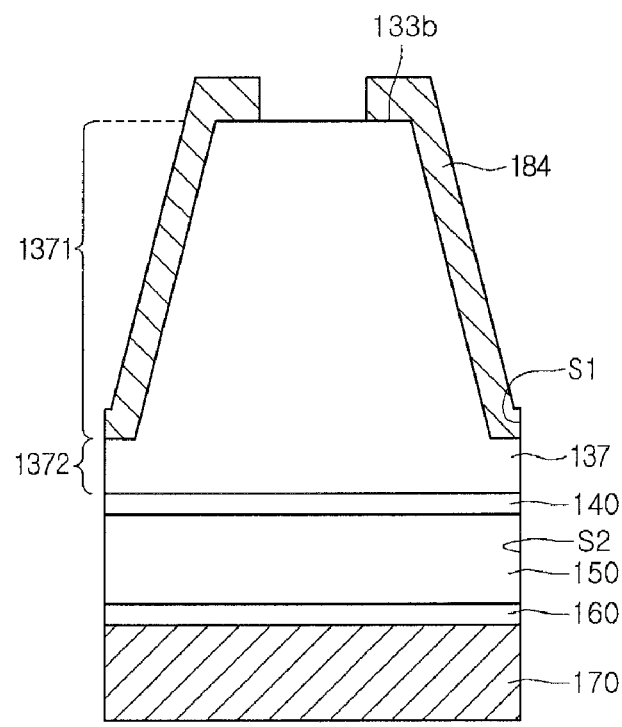
FIG. 13 is a sectional view showing a light emitting device according to still another embodiment.

FIG. 13 is a sectional view showing the light emitting device according to still another embodiment.

Referring to FIG. 13, a lateral side of a first region 1371 of a first semiconductor layer 137, on which a lateral electrode 184 is formed, is inclined with respect to the conductive support member 170, and a lateral side of a second region 1372 of the first semiconductor layer 137 is perpendicular to the conductive support member 170.

At this time, a lateral side S1 of the lateral electrode 184 is aligned in line with a lateral side of the second region 1372, a lateral side of the active layer 140, and a lateral side S2 of the second conductive semiconductor layer 150.

Figure 14:
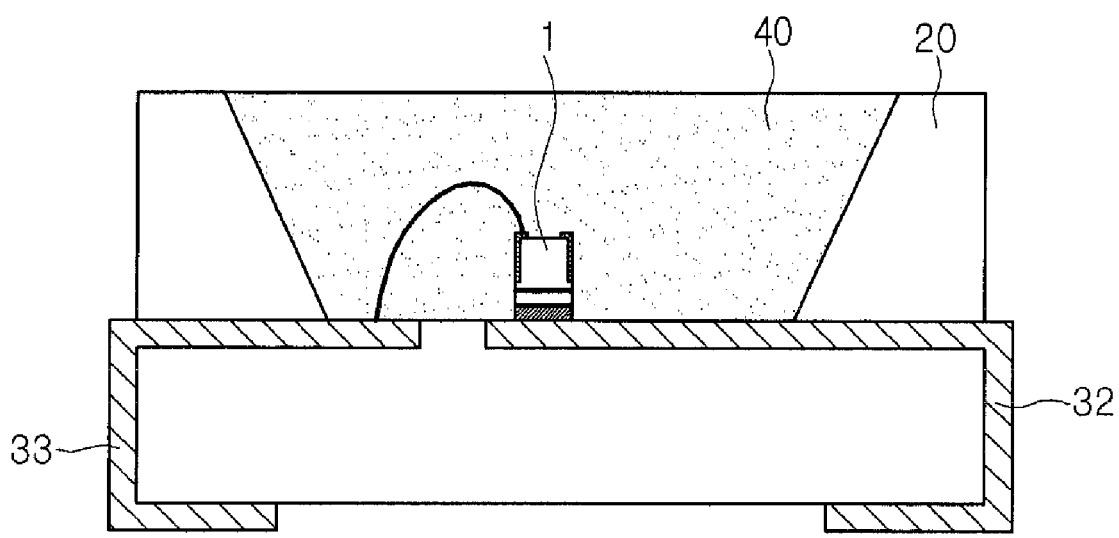
FIG. 14 is a sectional view showing a light emitting device package including a light emitting device according to the embodiment.

FIG. 14 is a sectional view showing a light emitting device package having the light emitting device according to the embodiment.

Referring to FIG. 14, the light emitting device package includes a body 20, first and second electrode layers 31 and 32 formed on the body 20, the light emitting device 1 provided on the body 20 and electrically connected to the first and second electrode layers 31 and 32 and a molding member 40 that surrounds the light emitting device 1. Although the light emitting device 1 according to the first embodiment is shown in FIG. 14, the embodiment is not limited thereto. The light emitting device according to another embodiment can be employed in the light emitting device package.

The body 20 may include silicon, synthetic resin or metallic material. An inclined surface may be formed around the light emitting device 1.

The first and second electrode layers 31 and 32 are electrically isolated from each other to supply power to the light emitting device 1. In addition, the first and second electrode layers 31 and 32 reflect the light emitted from the light emitting device 1 to improve the light efficiency and dissipate heat generated from the light emitting device 1 to the outside.

The light emitting device 1 can be installed on the body 20 or the first or second electrode layer 31 or 32.

Although it is illustrated that the light emitting device 1 is electrically connected to the first and second electrode layers 31 and 32 through a wire, the embodiment is not limited thereto. For instance, the light emitting device 1 can be electrically connected to the first and second electrode layers 32 through a die bonding scheme or a flip chip scheme.

The molding member 40 surrounds the light emitting device 1 to protect the light emitting device 1. In addition, the molding member 40 may include luminescence materials to change the wavelength of the light emitted from the light emitting device 1.

The light emitting device package may include at least one light emitting device according to the embodiment, but the embodiment is not limited thereto. A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 15:
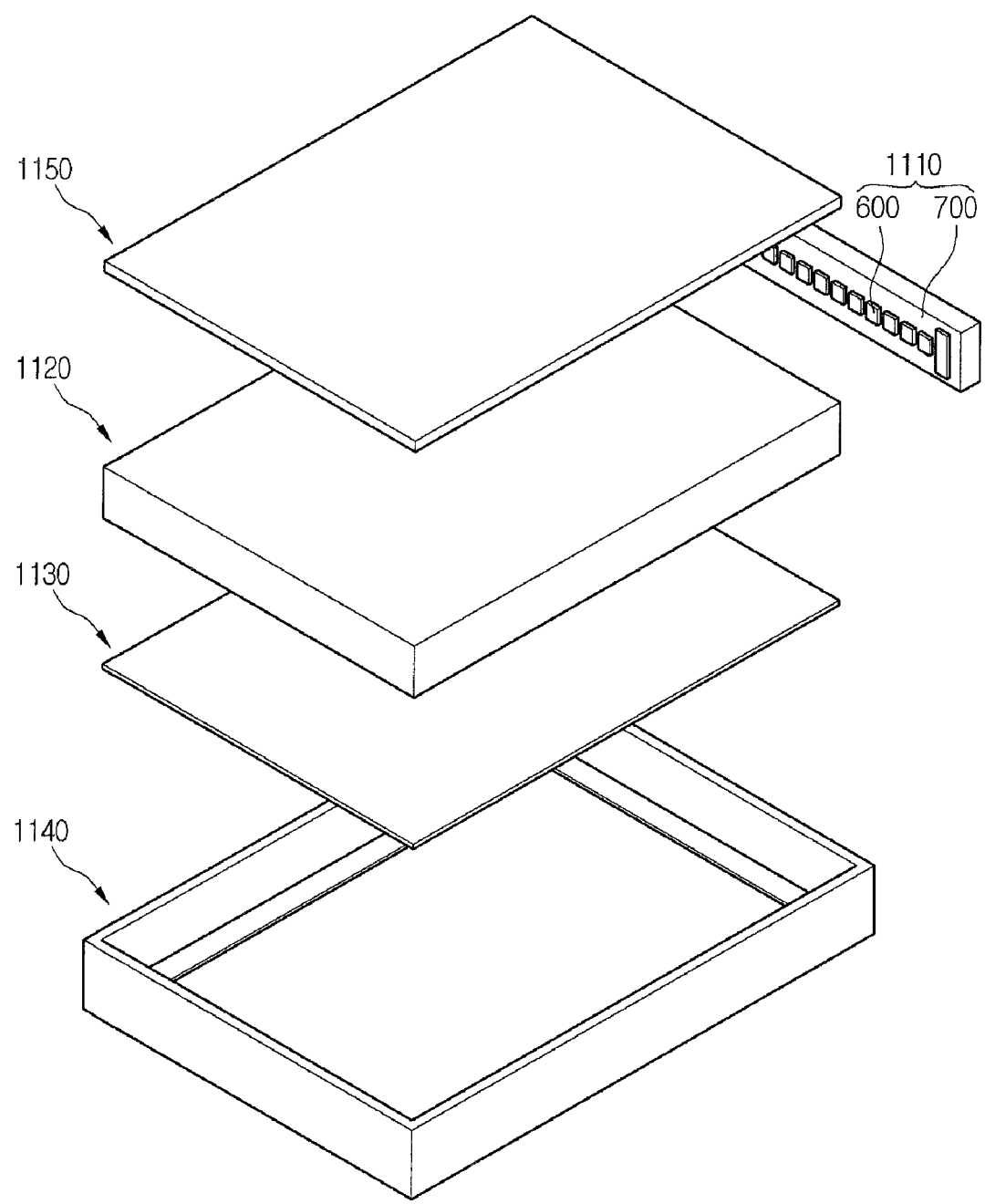
FIG. 15 is an exploded perspective view showing a backlight unit including a light emitting device package according to the embodiment.

FIG. 15 is an exploded perspective view showing a backlight unit 1100 including the light emitting device or the light emitting device package according to the embodiment. The backlight unit 1100 shown in FIG. 125 is an example of a lighting system and the embodiment is not limited thereto.

Referring to FIG. 15, the backlight unit 1100 includes a bottom cover 1140, a light guide member 1120 installed in the bottom cover 1140, and a light emitting module 1110 installed on at least one lateral side or a bottom surface of the light guide member 1120. In addition, a reflective sheet 1130 can be disposed under the light guide member 1120.

The bottom cover 1140 has a box shape having an open top surface to receive the light guide member 1120, the light emitting module 1110 and the reflective sheet 1130 therein. In addition, the bottom cover 1140 may include a metallic material or a resin material, but the embodiment is not limited thereto.

The light emitting module 1110 may include a substrate 700 and a plurality of light emitting device packages 600 installed on the substrate 700. The light emitting device packages 600 provide the light to the light guide member 1120. According to the light emitting module 1110 of the embodiment, the light emitting device packages 600 are installed on the substrate 700. However, it is also possible to direct install the light emitting device according to the embodiment.

As shown in FIG. 15, the light emitting module 1110 is installed on at least one inner side of the bottom cover 1140 to provide the light to at least one side of the light guide member 1120.

In addition, the light emitting module 1110 can be provided below the light guide member 1120 in the bottom cover 1140 to provide the light toward the bottom surface of the light guide member 1120. Such an arrangement can be variously changed according to the design of the backlight unit 1100 and the embodiment is not limited thereto.

The light guide member 1120 is installed in the bottom cover 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including luminescence materials.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 16:
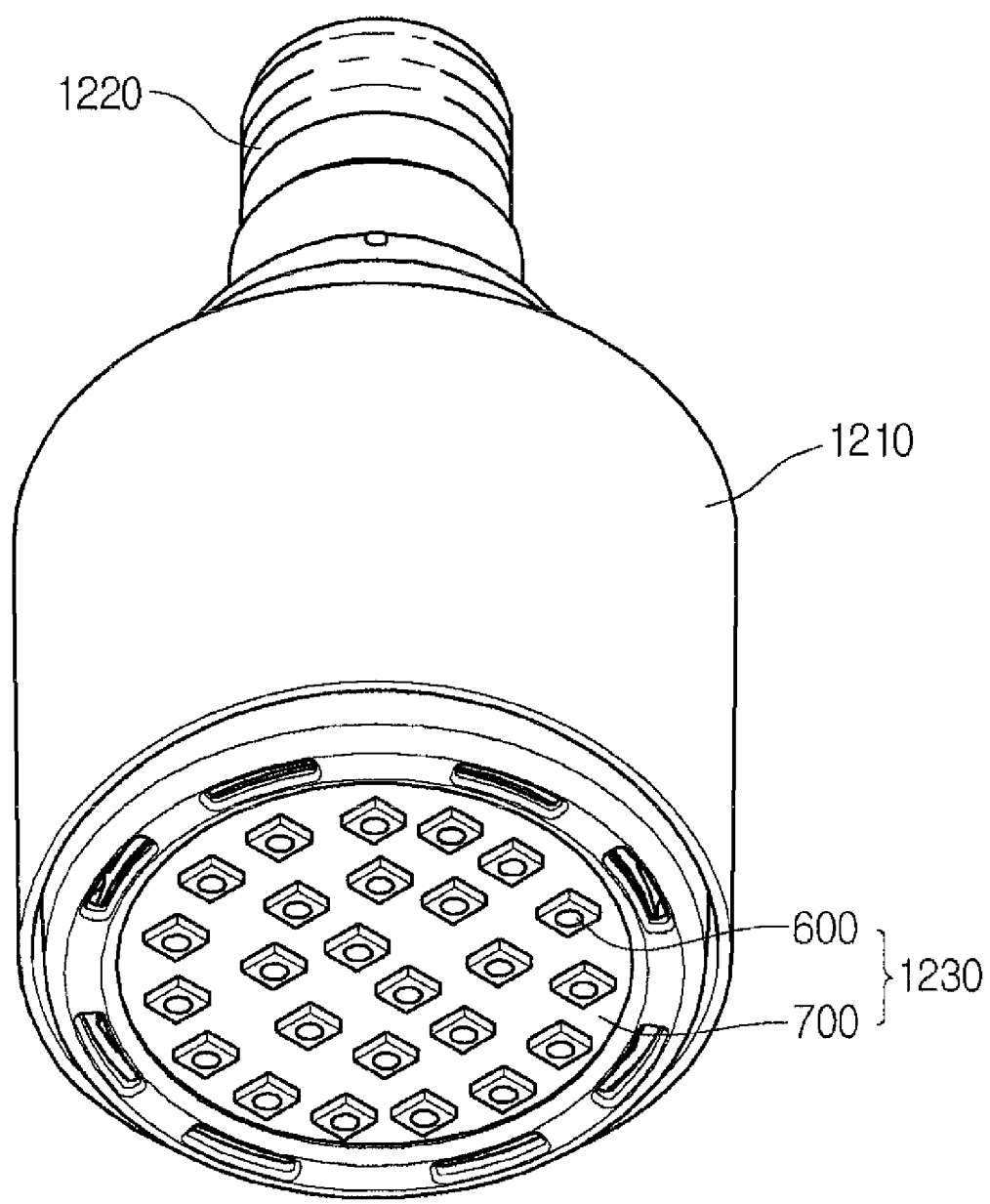
FIG. 16 is a perspective view showing a lighting unit including a light emitting device package according to the embodiment.

FIG. 16 is a perspective view showing a lighting unit 1200 including the light emitting device or the light emitting device package according to the embodiment. The lighting unit 1200 shown in FIG. 16 is an example of a lighting system and the embodiment is not limited thereto.

Referring to FIG. 16, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes a metallic material or a resin material.

The light emitting module 1230 may include a substrate 700 and at least one light emitting device package 600 installed on the substrate 700. According to the embodiment, the light emitting device package 600 is installed on the substrate 700. However, it is also possible to direct install the light emitting device 1 according to the embodiment.

The substrate 700 includes an insulating member printed with a circuit pattern. For instance, the substrate 700 includes a PCB (printed circuit board), an MC (metal core) PCB, a flexible PCB, or a ceramic PCB.

In addition, the substrate 700 may include material that effectively reflects the light. The surface of the substrate 700 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously combined to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescence materials. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 16, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

As described above, the lighting system includes the light emitting device or the light emitting device package, in which the current characteristics are improved and the operational voltage is lowered, so that the lighting system may have superior characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a second conductive semiconductor layer;
an active layer on the second conductive semiconductor layer;
a first semiconductor layer on the active layer, the first semiconductor layer having at least one lateral side with a step portion; and
a lateral electrode over the step portion formed at the at least one lateral side of the first semiconductor layer and extending over at least part of an uppermost surface of the first semiconductor layer.

2. The light emitting device of claim 1, wherein the step portion is formed on all lateral sides of the first semiconductor layer.

3. The light emitting device of claim 1, wherein the first semiconductor layer has a first surface adjacent to the active layer and a second surface opposite to the first surface, and
wherein the first semiconductor layer includes a first region extending from an end of the lateral electrode adjacent to the first surface to the second surface of the first semiconductor layer and a second region located between the first region and the active layer.

4. The light emitting device of claim 3, wherein the second region has a thickness substantially in a range of 0.1 μm to 0.3 μm.

5. The light emitting device of claim 3, wherein the first region has a thickness substantially in a range of 1.5 μm to 2.0 μm.

6. The light emitting device of claim 3, wherein a lateral side of the first region is inclined with respect to a bottom surface of the first semiconductor layer.

7. The light emitting device of claim 1, wherein the first semiconductor layer includes a first conductive semiconductor layer and an undoped semiconductor layer on the first conductive semiconductor layer.

8. The light emitting device of claim 1, wherein a portion of the lateral electrode extending over the uppermost surface of the first semiconductor layer is formed along an outer peripheral portion of the uppermost surface of the first semiconductor layer.

9. The light emitting device of claim 1, wherein the lateral electrode includes a pad part.

10. The light emitting device of claim 9, wherein the pad part is formed on the uppermost surface of the first semiconductor layer.

11. The light emitting device of claim 10, wherein the pad part is adjacent to an edge of the uppermost surface of the first semiconductor layer.

12. The light emitting device of claim 11, wherein the pad part includes a plurality of layers stacked to each other.

13. The light emitting device of claim 9, wherein the pad part includes a bonding layer and wherein the bonding layer includes at least one of Au, Au/Sn, SnPb or Pb-free solder.

14. The light emitting device of claim 1, wherein the lateral electrode includes a metal.

15. The light emitting device of claim 14, wherein the lateral electrode includes at least one of Ag, Al, Pt, or Pd.

16. The light emitting device of claim 1, wherein the lateral electrode includes a transparent conductive material.

17. The light emitting device of claim 16, wherein the lateral electrode includes at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au or Ni/IrOx/Au/ITO.

18. The light emitting device of claim 1, further comprising a conductive support member under the second conductive semiconductor layer.

19. The light emitting device of claim 1, wherein a lateral side of the lateral electrode is substantially aligned with lateral sides of the active layer and the second conductive semiconductor layer.

20. The light emitting device of claim 1, wherein the first semiconductor layer has a recess having a lower surface which includes the step portion, and wherein walls of the recess correspond to lateral sides of the first semiconductor layer.

21. The light emitting device of claim 20, wherein the recess extends to the uppermost surface of the first semiconductor layer.

22. The light emitting device of claim 21, wherein the lateral electrode has substantially a T-shape.

23. The light emitting device of claim 1, further comprising:
  a third semiconductor layer over the first semiconductor layer, wherein:
  the third semiconductor layer is not doped with a conductive dopant, and
  the third semiconductor layer is between the first semiconductor layer and a part of the lateral electrode that extends over at least part of the first semiconductor layer.

24. A light emitting device package comprising:
  a substrate; and
  a light emitting module including a light emitting device over the substrate, wherein the light emitting device comprises:
    a second conductive semiconductor layer;
    an active layer on the second conductive semiconductor layer;
    a first semiconductor layer on the active layer, the first semiconductor layer having at least one lateral side with a step portion; and
    a lateral electrode over the step portion formed at the at least one lateral side of the first semiconductor layer and extending over at least part of an uppermost surface of the first semiconductor layer.

* * * * *